United States Patent [19]

Berkcan

[11] Patent Number: 5,459,395
[45] Date of Patent: * Oct. 17, 1995

[54] REDUCED FLUX CURRENT SENSOR

[75] Inventor: Ertugrul Berkcan, Schenectady, N.Y.

[73] Assignee: General Electric Company, Schenectady, N.Y.

[*] Notice: The portion of the term of this patent subsequent to Aug. 1, 2012 has been disclaimed.

[21] Appl. No.: 85,789

[22] Filed: Jul. 6, 1993

[51] Int. Cl.$^6$ .............................. G01R 1/04; G01R 1/20; G01R 33/032; H01F 15/04
[52] U.S. Cl. ...................... 324/127; 324/126; 324/117 R; 336/55; 336/82; 338/49
[58] Field of Search .......................... 328/127; 324/126, 324/117 R; 336/55, 82; 338/47

[56] References Cited

U.S. PATENT DOCUMENTS

| | | | |
|---|---|---|---|
| 2,831,164 | 4/1958 | Johnson | 324/127 |
| 3,372,334 | 3/1968 | Fenoglio et al. | 324/126 |
| 3,665,357 | 5/1972 | Tsubouchi et al. | 336/73 |
| 3,921,069 | 11/1975 | Milkovic | 324/107 |
| 3,995,210 | 11/1976 | Milkovic | 324/94 H |
| 4,140,961 | 2/1979 | Akamatsu | 323/6 |
| 4,182,982 | 1/1980 | Wolf et al. | 324/127 |
| 4,240,059 | 12/1980 | Wolf et al. | 338/49 |
| 4,255,704 | 3/1981 | Milkovic | 324/127 |
| 4,255,705 | 3/1981 | Milkovic | 324/127 |
| 4,278,940 | 7/1981 | Milkovic | 324/127 |
| 4,286,214 | 8/1981 | Milkovic | 324/142 |
| 4,414,510 | 11/1983 | Milkovic | 324/252 |
| 4,492,919 | 1/1985 | Milkovic | 324/127 |
| 4,494,068 | 1/1985 | Ley et al. | 324/126 |
| 4,495,463 | 1/1985 | Milkovic | 324/142 |
| 4,513,274 | 4/1985 | Halder | 336/173 |
| 4,580,095 | 4/1986 | DeVries | 324/126 |
| 4,626,778 | 12/1986 | Friedl | 324/127 |
| 4,684,827 | 8/1987 | Ohms | 307/413 |
| 4,794,326 | 12/1988 | Friedl | 324/117 |
| 4,810,989 | 3/1989 | Brandenberg et al. | 336/84 |
| 4,835,463 | 5/1989 | Baran et al. | 324/123 |
| 4,894,610 | 1/1990 | Friedl | 324/127 |
| 4,912,396 | 3/1990 | Groenenboom | 324/117 R |
| 4,939,451 | 7/1990 | Baran et al. | 324/127 |
| 4,947,107 | 8/1990 | Doerfler et al. | 324/96 |
| 4,999,692 | 3/1991 | Ristic et al. | 357/127 |
| 5,027,059 | 6/1991 | de Montgolfier et al. | 324/127 |
| 5,066,904 | 11/1991 | Bullock | 324/127 |

OTHER PUBLICATIONS

"Faraday Effect Sensors: The State of the Art," GW Day, AH Rose, SPIE vol. 985, Fiber Optic and Laser Sensors VI (1988), pp. 138–150.
"Integrated Semiconductor Magnetic Field Sensors," Henry P. Baltes, Proceedings of the IEEE, vol. 74, No. 8, Aug. 1986, pp. 1107–1132.
"GE Type EV and Phase3 Meters, Signal Conditioning and Scaling," Donald F. Bullock, David D. Elmore, GE Meter & Control Business, Somersworth, N.H. 03878, Mar. 1991.
"Differential Current Sensing Method and Apparatus," Ser. No. 08/043,903, filed Apr. 7, 1993.
"Electrical Measurements" From Electrical Engineering Texts By Frank A. Laws, Mass. Institute of Tech. 1938, pp. 72–75.

Primary Examiner—Kenneth A. Wieder
Assistant Examiner—Barry C. Bowser
Attorney, Agent, or Firm—Enrique J. Mora; Marvin Snyder

[57] ABSTRACT

An alternating current sensor for measuring a primary alternating current inducing a magnetic flux density defined over a known region comprises: a first sensor for measuring changes in magnetic flux due to the primary current over a first predetermined area included within the known region; a second sensor for measuring changes in magnetic flux due to the primary current over a second predetermined area within the known region, the changes in magnetic flux measured by the second sensor being a predetermined amount different from the changes in magnetic flux measured by the first sensor; and a current source for generating a current inducing changes in magnetic flux over a third predetermined area to offset the difference between the changes in magnetic flux measured by the first sensor and the changes in magnetic flux measured by the second sensor.

19 Claims, 4 Drawing Sheets

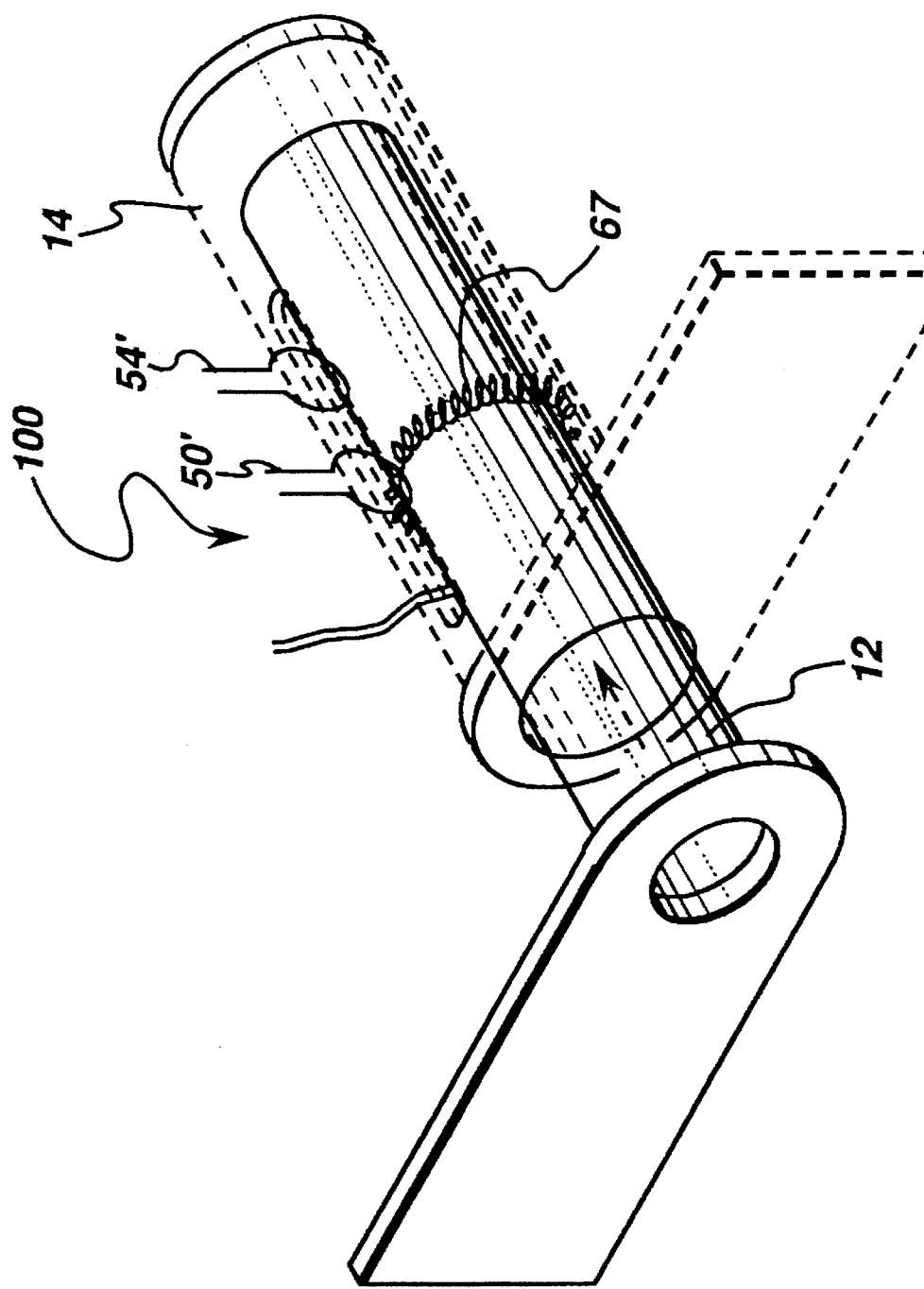

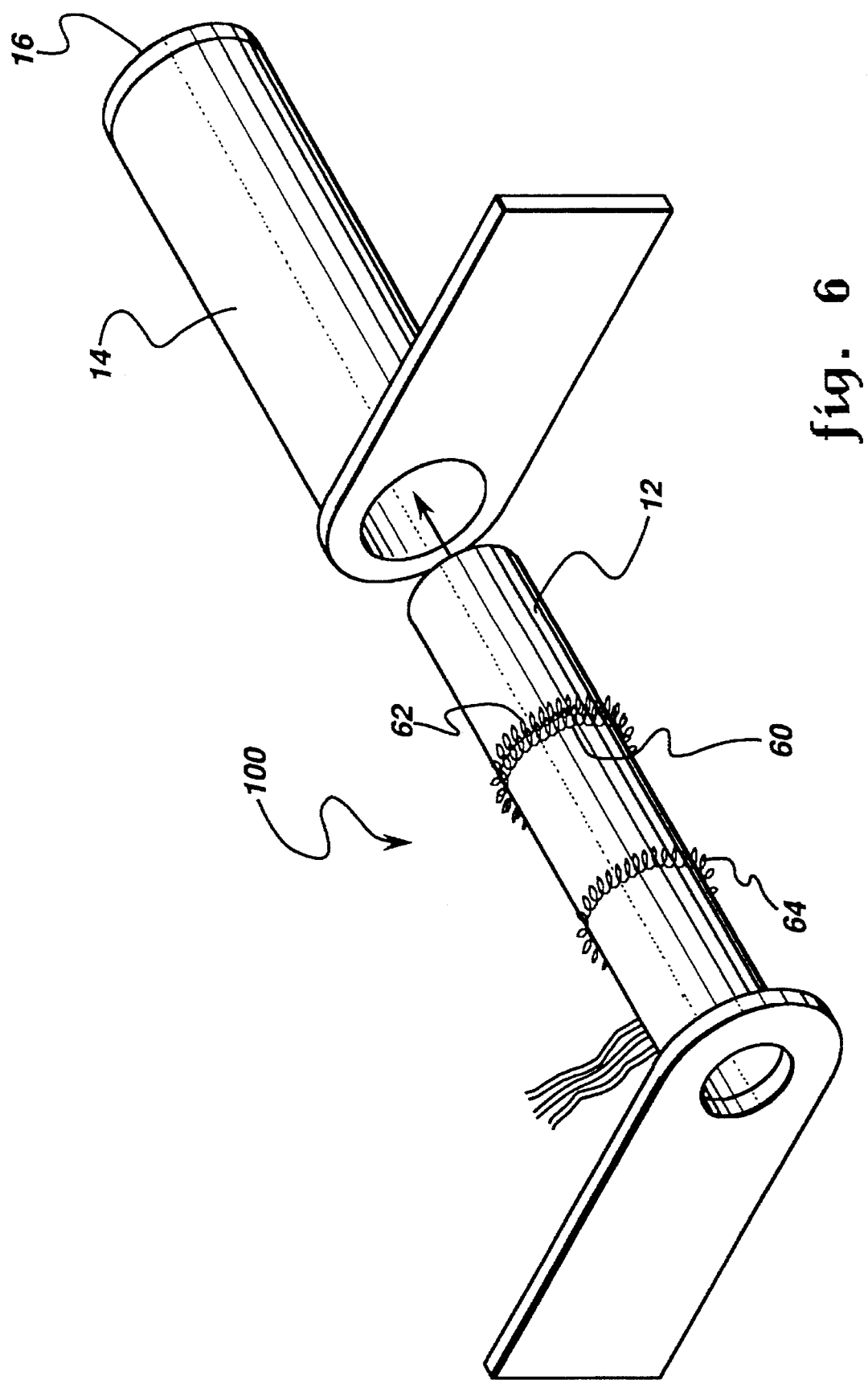

5,459,395

REDUCED FLUX CURRENT SENSOR

RELATED APPLICATIONS

This application is related to patent application Ser. No. 08/085,787 entitled "Noninductive Shunt Current Sensor," by Berkcan, filed Jul. 6, 1993, patent application Ser. No. 08/085790 entitled "Current Sensor Employing a Mutually Inductive Current Sensing Scheme with a Magnetic Field Substantially Uniform in Angular Direction," by Berkcan et al., filed Jul. 6, 1993, and patent application Ser. No. 08/085788 entitled "Current Sensor Employing a Mutually Inductive Current Sensing Scheme," by Berkcan et al., filed Jul. 6, 1993, all of the foregoing assigned to the assignee of the present invention and herein incorporated by reference.

FIELD OF THE INVENTION

This invention relates to current sensors and, more particularly, to a current sensor that measures current by partially offsetting or reducing the changes in magnetic flux due to the current to be measured.

BACKGROUND OF THE INVENTION

Current sensors, such as U.S. Pat. No. 5,066,904, entitled "Coaxial Current Sensors," by Bullock, issued Nov. 19, 1991, assigned to the assignee of the present invention and herein incorporated by reference, are known in the art. These sensors, although useful, suffer from some disadvantages including the need for a current shunt to help reduce the expense of the current sensor by reducing the number of ampere-turns in the active part of the current sensor while also obtaining an accurate measurement of the current. However, even the use of an accurate current shunt typically introduces some expense due to the current sensor materials, such as low temperature coefficient materials, the large number of coil "turns" in the sensing and feedback coils of the current shunt, as well as the manufacturing care required to fabricate the current sensor. Thus, a need exists for a current sensor that overcomes these problems.

SUMMARY OF THE INVENTION

One object of the invention is to provide a current sensor based on reducing or partially offsetting the changes in magnetic flux due to the current to be sensed.

Another object of the invention is to provide a current sensor that eliminates the need for a current shunt.

Briefly, in accordance with one embodiment of the invention, an alternating current sensor for measuring an alternating primary current inducing a magnetic flux density defined over a known region comprises: a first sensor for measuring changes in magnetic flux due to the primary current over a first predetermined area included within the known region; a second sensor for measuring changes in magnetic flux due to the primary current over a second predetermined area included within the known region, the changes in magnetic flux measured by the second magnetic flux sensor being a predetermined amount different from the changes in magnetic flux measured by the first magnetic flux sensor; and a current source for generating a current inducing changes in magnetic flux over a third predetermined area to offset the difference between the changes in magnetic flux measured by the first magnetic flux sensor and the changes in magnetic flux measured by the second magnetic flux sensor.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may be best be understood by reference to the following detailed description when read with the accompanying drawings in which:

FIG. 5 is yet another embodiment of a reduced flux current sensor in accordance with the invention.

FIG. 6 is one more embodiment of a reduced flux current sensor in accordance with the invention.

DETAILED DESCRIPTION OF THE INVENTION

Figure 1:
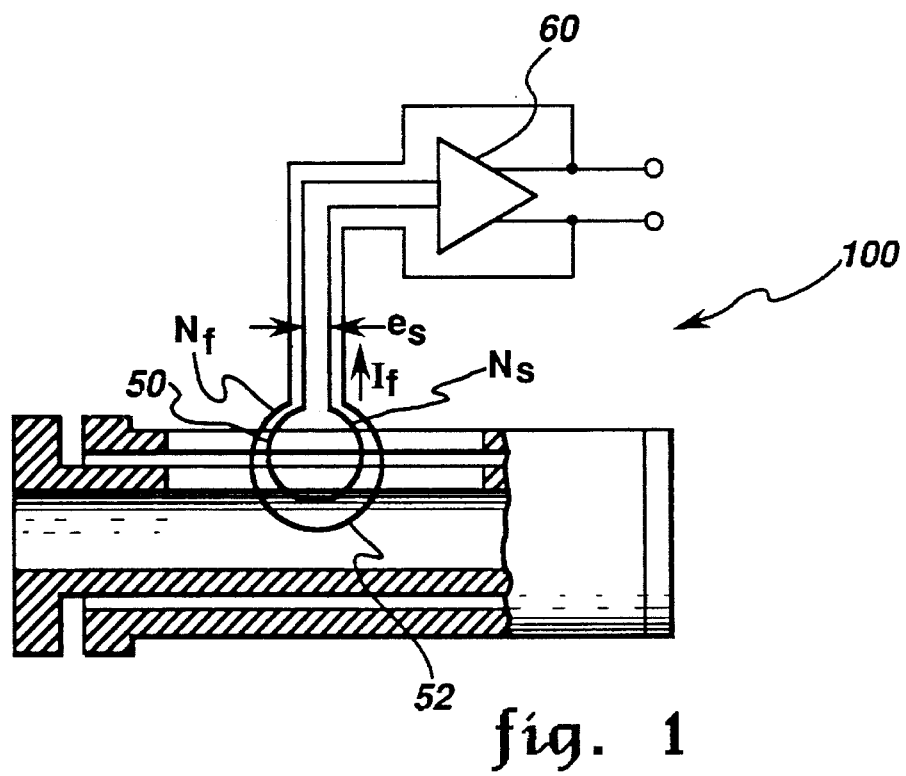
FIG. 1 is a schematic diagram of an embodiment of a flux cancelling current sensor.

FIG. 1 illustrates an embodiment of a current sensor 100 in which flux cancelling occurs. In general, the use of such a current sensing scheme entails supplying an ampere-current or magnetic flux changes equal, but opposite, to the changes in magnetic flux due to the primary current through the current sensor which is to be measured. In the context of the invention, changes in magnetic flux refers to the time rate of change of magnetic flux. For the current sensor illustrated in FIG. 1, a magnetic field substantially uniform in angular direction and, thus, having substantially parallel magnetic field lines exists between two conductive hollow cylinders comprising the current sensor, such as one of the type illustrated in patent application Ser. No. 08/085,790. As illustrated, a slot or opening in the cylinders provides access to the magnetic field for a sensor or element for sensing changes in magnetic flux, such as a conductive coil. The primary current through the current sensor induces a magnetic flux density substantially defined over a known area, such as the cross-sectional area of the current sensor. A first sensor or sensing element 50 for sensing changes in magnetic flux, such as a coil, provides measurements of the changes in magnetic flux due to the primary current over a first predetermined area, in this embodiment the area being determined by the sensing element. Thus, as illustrated in FIG. 1, sensing element 50 may comprise a coil having a predetermined cross-sectional area. Likewise, a current source, such as coil 52 coupled to the output of an operational amplifier, is provided for generating a current inducing changes in magnetic flux to offset the changes in magnetic flux due to the primary current over a second predetermined area. In FIG. 1, the second predetermined area is illustrated as within the first predetermined area. As illustrated, the current source may comprise a coil 52 coupled or connected to the output ports of an instrumentation or operational amplifier 60 whose input ports are connected or coupled to sensing element or coil 50. Thus, as illustrated, a current induced by sensor or sensing element 50 for sensing changes in magnetic flux is provided to operational amplifier 60 and amplified to provide a feedback voltage that induces a feedback current to cancel the changes in magnetic flux of the primary current. This may be shown or illustrated mathematically as follows.

$$e_s = N_s \frac{d}{dt}(\phi_p - \phi_2), \quad [1]$$

where $\phi_p$ and $\phi_2$ refer to the magnetic flux attributed to or due to the primary current over the area of the sensing element 50 and the magnetic flux attributed to or due to the current source or feedback current over the area of the feedback coil, respectively. Thus, $$\phi_2 \alpha N_f I_f$$
$$\phi_p \alpha I, \quad [2]$$

resulting in $$e_s \alpha N_s I - N_s N_f \frac{d}{dt} I_f. \quad [3]$$

Next, requiring $e_s = 0$ in the above relationship provides $$I_f \alpha \frac{I}{N_f}. \quad [4]$$

Due to the relationship illustrated in equation [4] regarding the primary current and the number of coil turns in the feedback or second coil for cancelling the changes in magnetic flux due to the primary current, a current shunt may be used to divide the current to be sensed. This may be followed by a second division to reduce the current further. Unfortunately, even for the embodiment previously illustrated, an accurate current shunt is sometimes not economic to produce because of the cost of carefully fabricating a shunt with the number of turns to achieve the accuracy of measurement desired. Likewise, temperature variations may introduce accuracy problems for the shunt.

Figure 2:
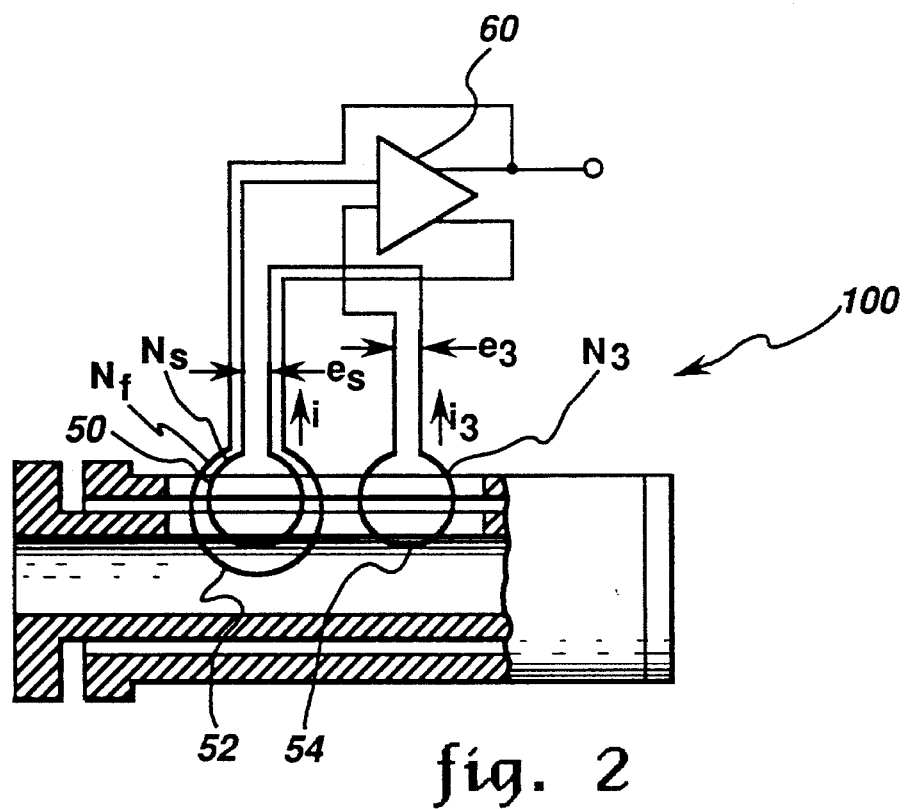
FIG. 2 is a schematic diagram of an embodiment of a reduced flux current sensor in accordance with the invention.

In contrast with the previously described current sensor, a reduced flux current sensor 100 in accordance with the invention, such as illustrated in the embodiment of FIG. 2, uses a second or reference sensor or sensing element for sensing changes in magnetic flux, in this particular embodiment coil 54, coupled to operational or instrumentation amplifier 60, not to cancel the changes in magnetic flux measured over a first predetermined area by the first sensing element, but to measure changes in magnetic flux over a second predetermined area due to the primary current, the changes in magnetic flux measured by the second sensing element being a predetermined amount different from the changes in magnetic flux measured by the first sensing element. This is achieved by using a reference sensor or sensing element to provide a reference measurement of changes in magnetic flux over a second predetermined area, such as the area of coil 54 in the amplifier configuration shown in FIG. 2. Thus, in this embodiment the number of turns in the coil 54 is $N_3 = N_s - \Delta$ and coil 52 is coupled to amplifier 60, such as an operational or instrumentation amplifier, to provide a current source for generating a current inducing magnetic flux changes to offset the difference between the changes in magnetic flux measured by the first sensing element, coil 50 in FIG. 2, and the changes in magnetic flux measured by the second or reference sensing element, coil 54 in FIG. 2. Although the cross-sectional areas of coils 50 and 54 are oriented substantially perpendicular to the direction of the magnetic field, it will now be appreciated that the cross-sectional area of the coils may be oriented at a predetermined angle with respect to the magnetic field other than substantially perpendicular so long as this orientation or predetermined angle is taken into account with regard to sensing and offsetting the changes in magnetic flux. Likewise, coil 52 may be oriented at a predetermined angle with respect to the direction of the magnetic field, such as substantially perpendicular to it. It will also be appreciated that the second or reference sensing element or sensor for sensing changes in magnetic flux also need not have a magnetic flux over an area in common or incorporated within the cross-sectional area of the first sensing element. However, it may be desirable for coil 52 to have a cross-sectional area overlapping with the cross-sectional area of the first sensing element. Thus, the first sensor or sensing element may sense changes in magnetic flux over a first predetermined area, the second sensor or sensing element may sense changes in magnetic flux over a second predetermined area, and the current source may generate a current for inducing magnetic flux changes over a third predetermined area, the third area substantially overlapping the first area.

As illustrated, the difference between the voltage outputs of coils 50 and 54 are provided to the input ports of amplifier 60 by a reverse series connection or configuration to provide negative or offsetting changes in magnetic flux. In this embodiment of a reduced flux current sensor in accordance with the invention, "emf" is given by equation [3] provided earlier. However, now the condition that $e_s = e_3$ provides the following equation:

$$N_s I - N_s N_f \frac{d}{dt} i = (N_s - \Delta) I, \quad [5]$$

providing the results $$i \alpha \frac{\Delta I}{N_s N_f}. \quad [6]$$

Comparing equation [6] to equation [4] leads to the conclusion that only a small current, i, relative to the current sensor illustrated in FIG. 1, need be supplied, because the changes in magnetic flux of the primary current are being reduced by a much smaller value in comparison with the earlier approach. Thus, a smaller number of ampere-turns now being required to accommodate a smaller current, as well as removing the need for a current shunt, results in an economical and desirable current sensor. The feedback current, i, in coil 52 is proportional to the original or primary current to be sensed and provides an accurate current measure. Likewise, avoiding a current shunt may avoid inaccuracies in the current measurements associated with the temperature dependence of the materials used for the current shunt.

Although the previous description indicates that the reference or second sensing element may provide a measurement of the changes in magnetic flux due to the primary current a predetermined amount different from the first sensing element by employing a different number of coil turns, the invention is not restricted in scope to this approach. For example, instead of using a different number of coil turns, a different cross-sectional area over which to measure the changes in magnetic flux may be employed. In general, any technique that suitably calibrates the difference in measurements of the changes in magnetic flux between the first sensing element and the second sensing element may be employed. Likewise, this predetermined difference established between the two sensing elements does not require that the magnitude of the changes in magnetic flux measured by the first sensing element exclusively exceed those of the second sensing element or vice-versa, so long as the difference may be calibrated and may be offset by a current source, as previously described.

Figure 3:
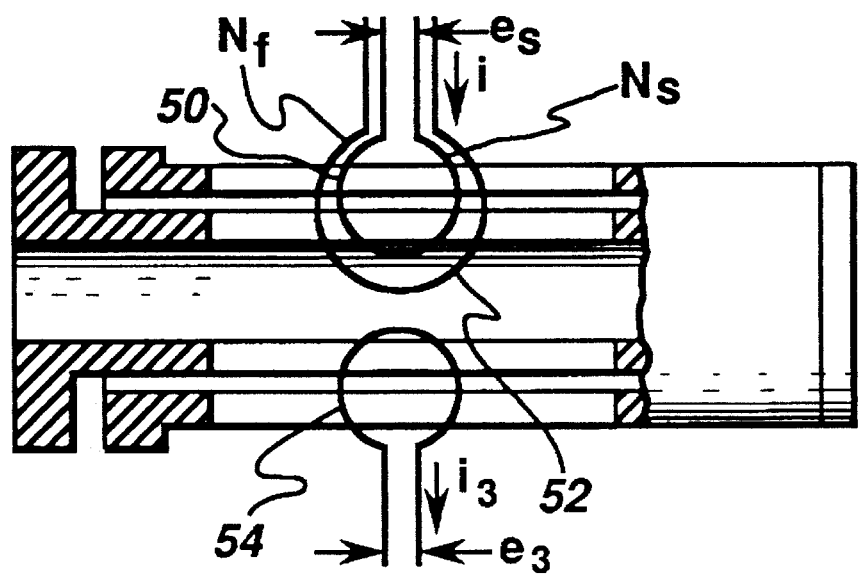
FIG. 3 is a schematic diagram of an alternative embodiment of a reduced flux current sensor in accordance with the invention.
Figure 4:
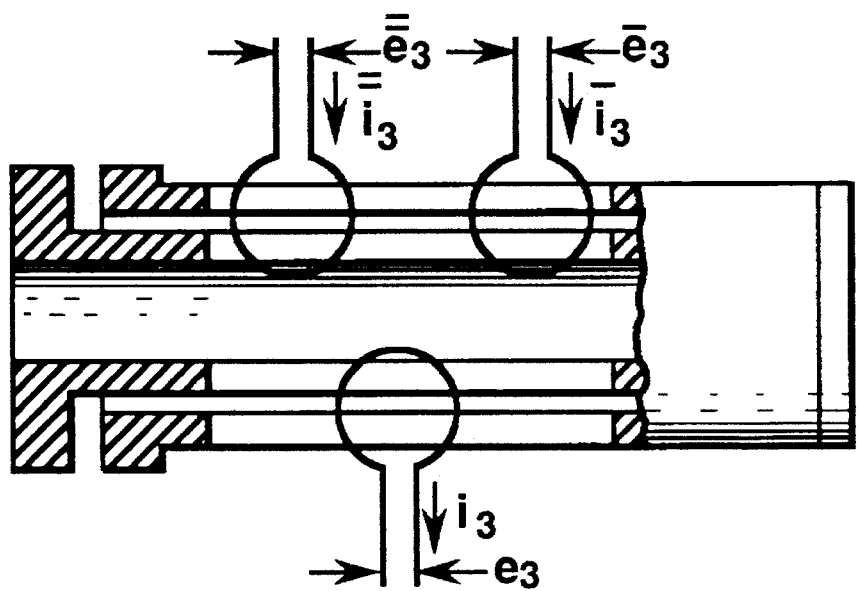
FIG. 4 is a schematic diagram of an alternative geometric arrangement of reference sensors for sensing changes in magnetic flux, such as may be employed in an embodiment of a reduced flux current sensor in accordance with the invention.

In alternative embodiments, the reference or second sensing element may be placed in alternative locations in the current sensor including the opposite side of a current sensor of the type described in patent application Ser. No. 08/085,790. This is shown schematically in FIG. 3 with the details regarding the amplifiers omitted for convenience. Likewise, as illustrated in FIG. 4, additional reference coils or sensing elements may be introduced to improve the signal obtained and provide additional immunity against external magnetic fields, and hence, more robust measurements. As illustrated, the three coils or sensing elements are geometrically arranged with respect to one another. Thus, the differences between the voltages generated by various selected pairs of coils or sensing elements may be used to measure the external magnetic fields that vary in diverse directions, such as along the cylinders. Similarly, this technique may be employed to provide a measurement of the fields varying in the direction orthogonal to the cylinders or their major axes.

Likewise, the current source for generating a current to induce changes in magnetic flux to offset the difference between the changes in magnetic flux measured by the first sensing element and the changes in magnetic flux measured by the second or reference sensing element may be implemented a number of ways. For example, a transconductance amplifier may be employed that converts voltage, such as the voltage provided by the reversed series connection of coils 50 and 54, to current. This may be conventionally implemented by an operational amplifier or instrumentation amplifier coupled to a buffer amplifier. Likewise, other conventional embodiments may be employed, such as described in *Modern Electronic Circuits Reference Manual*, by John Markus and available from the McGraw-Hill Book Company (1980) or in *IC Op-Amp Cookbook*, 3d Ed., by Walter C. Jung, and available from MacMillian, Inc. (1993).

FIG. 5 illustrates yet another embodiment of a reduced flux current sensor in accordance with the present invention. It will now be appreciated that many different embodiments of a reduced flux current sensor are possible and the invention is not limited in scope to the particular embodiments described herein. For example, the sensors or sensing elements for sensing changes in magnetic flux need not be coils and may, alternatively, comprise hall effect sensors, optical sensors, or other sensors that may be employed to measure changes in magnetic flux. Likewise, a sensing element for measuring changes in magnetic flux may alternatively comprise, for example, a semiconductor device. In one such embodiment, the top surface of the device may be oriented substantially perpendicular to the direction of the magnetic field. In this configuration, a voltage may be induced between electrical contact terminals suitable bonded to the semiconductor device, the voltage being due to the changes in magnetic flux through the cross-sectional area of the device. Furthermore, the invention is not restricted in scope to having all the sensing elements and current sources in the same plane or in opposing locations in the body of the current sensor. For example, as illustrated in FIG. 5, instead of coil 52, a toroidal feedback coil 67 may be placed in the space between the inner surface of cylinder 14 and the outer surface of cylinder 12. This particular configuration exploits and preserves the lack of a magnetic field outside outer cylinder 14 or inside inner cylinder 12. More particularly, since the field inside the toroid is substantially uniform in angular direction it is thus substantially perpendicular to the plane of coil 50' for the first sensing element and coil 54' for the second or reference sensing element in the slot or opening in the cylinders illustrated in FIG. 5. This concentrated magnetic field offers the possibility of enhanced current measurements. Likewise, the toroidal coil may be embedded in or wound around a ferromagnetic material, such as ferrite or μ-metal, filling this space between the cylinders to enhance the electromagnetic field established.

A reduced flux current sensor in accordance with the present invention has a number of advantages. First, as previously suggested, there is substantially no magnetic field inside the inner cylinder or outside the outer cylinder of the two cylinders where that embodiment is employed. This is particularly advantageous for metering applications, where, as previously discussed, several current sensors are employed in close proximity to each other, such as in a three-phase network. Likewise, this avoids the need for magnetic insulation which is undesirable and, furthermore, may not provide effective insulation in the presence of magnetic fields having a strong DC component which may saturate the insulating material. Yet another advantage is that the current sensor is relatively insensitive to external magnetic fields, such as the magnetic field due to the conductors to the current source and other sources of noise. This occurs at least in part because the sensors or sensing elements for sensing changes in magnetic flux are located in a plane perpendicular to the direction of a magnetic field substantially uniform in angular direction so that the dot product of these external fields with the area through the sensing elements and hence, the flux may be essentially zero. This insensitivity also applies in relation to direct current where no voltage would be induced by a nonchanging flux. It may be demonstrated that the current sensor is not only insensitive to uniform external magnetic fields, but also uniform temperature effects. Likewise, external magnetic field gradients and temperature gradients may be corrected for by conventional digital signal processing techniques. Finally, the effect of noise on this type of feedback coil configuration is at least no worse and possibly better than other alternative types of current sensor configurations, such as the aforementioned U.S. Pat. No. 5,066,904.

Yet another advantage of a current sensor in accordance with the invention is that the magnetic flux is concentrated in the space or the predetermined radial distance or separation between the outer surface of the outer pipe and the inner surface of the inner pipe, where an inner pipe is used, thus improving accuracy in addition to simplifying the current sensor structure and making it relatively easy to manufacture. As previously discussed, this advantage may be improved further by the use of a toroidal feedback coil as illustrated in FIG. 5. Furthermore, several sensing elements may be inserted at arbitrary locations between the outer pipe and an inner cylindrical conductive element or pipe, thus providing a better measurement of the current due to the improved signal obtained. In particular, as illustrated in FIG. 4, the placement of the reference sensing elements may be employed to improve the measurement obtained. Further, as illustrated in FIG. 6 and described in more detail hereinafter, an embodiment of a reduced flux current sensor in accordance with the invention may be made to accommodate at least two other current sensing schemes, such as those described in patent application Ser. No. 08/085,790 and in patent application Ser. No. 08/085,787 effectively providing three current measurements in one device. Nonetheless, it will now be appreciated that although offering a convenient embodiment, a reduced flux current sensor in accordance with the invention is not restricted to the concentric pipes or hollow cylinders configuration previously discussed. Yet even for such other embodiments for a reduced flux current sensor in accordance with the invention, such a current sensor avoids the need for a current shunt thus removing inaccuracies due to temperature variations and reducing the expense of the current sensor, as previously suggested.

FIG. 6 illustrates an embodiment of a reduced flux current sensor in accordance with the invention that may also accommodate the current sensing schemes described in patent application Ser. No. 08/085,790 and in patent application Ser. No. 08/085,787. As illustrated, current sensor 100 comprises a pair of concentric hollow cylinders or pipes, 12 and 14, electrically connected by a washer 16, thus enabling the noninductive shunt current sensor as described in patent application Ser. No. 08/085,787. Likewise, coils 60, 62, and 64 are provided in the space between the outer surface of pipe 12 and the inner surface of pipe 14. Thus, any of these coils may be employed in a mutually inductive current sensing scheme with a magnetic field substantially uniform in angular direction, such as described in patent application Ser. No. 08/085,790. Finally, coil 60, 62, and 64 may respectively correspond to coils 50, 52, and 54 illustrated in FIG. 2 to provide a reduced flux current sensor in accordance with the invention. In particular, as illustrated, the cross-sectional areas of coils 60 and 62 substantially overlap.

A method of measuring a primary current inducing a magnetic flux density at least defined over a known region may be performed in the following manner. Changes in the magnetic flux due to the primary current over a first predetermined area within the known region are sensed. Changes in the magnetic flux due to the primary current over a second predetermined area with the known region are also sensed. The changes in magnetic flux due to the primary current are sensed so that the magnetic flux changes sensed over the first area are a predetermined amount different from the magnetic flux changes sensed over the second area. A current is generated inducing magnetic flux changes over a third predetermined area to substantially offset the difference between the changes in magnetic flux sensed over the first area and the changes in magnetic flux sensed over the second area. The invention is not restricted in scope to having the magnitude of the changes in magnetic flux over the first area exceed or be less than the magnitude of the changes in magnetic flux sensed over the second area. Thus, it is sufficient that the difference in the sensed changes in magnetic flux be a predetermined amount that may be suitably calibrated. Likewise, after generating the current to induce changes in magnetic flux to substantially offset the difference between the sensed changes in magnetic flux over the first area and the changes in magnetic flux sensed over the second area, the current generated is measured. Likewise, the measurement of the current generated is then converted into a measurement of primary current. Furthermore, as previously suggested, it is desirable to have the first predetermined area substantially overlap with the third predetermined area, such as illustrated in FIG. 2.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An alternating current sensor for measuring an alternating primary current inducing a magnetic flux density at least defined over a known region comprising:

a first sensor for measuring time rate changes in magnetic flux due to the primary current over a first predetermined area within the known region;

a second sensor for measuring time rate changes in magnetic flux due to the primary current over a second predetermined area within the known region, the time rate changes in magnetic flux due to the primary current measured by said second sensor being a predetermined calibrated amount different from the time rate changes in magnetic flux due to the primary current measured by said first sensor; and a current source for generating a current inducing time rate changes in magnetic flux over a third predetermined area within the known region to substantially offset the difference between the time rate changes in magnetic flux due to the primary current measured by said first sensor and the time rate changes in magnetic flux due to the primary current measured by said second sensor.

2. The alternating current sensor of claim 1, wherein the magnitude of the time rate changes in magnetic flux said first sensor is adapted to measure exceeds the magnitude of the time rate changes in magnetic flux said second sensor is adapted to measure.

3. The alternating current sensor of claim 1, wherein the magnitude of the time rate changes in magnetic flux said second sensor is adapted to measure exceeds the magnitude of the time rate changes in magnetic flux said first sensor is adapted to measure.

4. The alternating current sensor of claim 1, wherein said first sensor and said second sensor respectively comprise a first conductive coil and a second conductive coil, said coils each having a cross-sectional area oriented at a predetermined angle with respect to the direction of the magnetic field induced by the primary current.

5. The alternating current sensor of claim 4, wherein said coils each have a cross-sectional area oriented substantially perpendicular with respect to the direction of the magnetic field induced by the primary current.

6. The alternating current sensor of claim 4, wherein said current source comprises a third conductive coil coupled across the output ports of an amplifier, said third coil having a cross-sectional area oriented at a predetermined angle with respect to the direction of the magnetic field induced by the primary current.

7. The alternating current sensor of claim 5, wherein said current source comprises a third conductive coil coupled across the output ports of an amplifier, said third coil having a cross-sectional area oriented substantially perpendicular with respect to the direction of the magnetic field induced by the primary current.

8. The alternating current sensor of claim 7, wherein said first and second conductive coils are coupled to each other in a reverse series configuration and across the input ports of said amplifier.

9. The alternating current sensor of claim 1, wherein said first predetermined area and said third predetermined area substantially overlap.

10. The alternating current sensor of claim 4, wherein said first and second coils each have a predetermined number of coil loops, the number of coil loops in said first coil being different from the number of coil loops in said second coil.

11. The alternating current sensor of claim 8, and further comprising:

two concentric pipes, each having a first end, a second end, an inner surface, an outer surface;

the respective second ends of said pipes being electrically connected by a conductive bridge to form a connected conductive path between the first end of the inner pipe and the first end of the outer pipe;

each of said pipes having at least one slot for receiving said first, second, and third coils so that each respective one of the three coils is substantially situated in a predetermined region between the outer surface of the inner pipe and the inner surface of the outer pipe, the at least one slot in the outer pipe substantially overlapping the at least one slot in the inner pipe.

12. The alternating current sensor of claim 7, and further comprising:

two concentric pipes, each having a first end, a second end, an inner surface, an outer surface;

the respective second ends of said pipes being electrically connected by a conductive bridge to form a connected conductive path between the first end of the inner pipe and the first end of the outer pipe;

the outer surface of the inner pipe being spaced a predetermined radial distance from the inner surface of the outer pipe;

said third coil comprising a toroidal coil having a plurality of coil loops, said toroidal coil being located in the space between the inner and outer pipe, said toroidal coil loops each having a cross-sectional area oriented substantially perpendicular with respect to the direction of the magnetic field induced by the flow of the primary current along the conductive path.

13. The alternating current sensor of claim 12, wherein said first and second coils each comprise toroidal coils having a plurality of coil loops, the first and second coils being located in the space between the inner and outer pipe, the toroidal coil loops each having a cross-sectional area oriented substantially perpendicular with respect to the direction of the magnetic field induced by the flow of the primary current along the conductive path.

14. A method of measuring a primary alternating current inducing a magnetic flux density at least defined over a known region, said method comprising the steps of:

sensing time rate changes in magnetic flux due to the primary current over a first predetermined area within the known region;

sensing time rate changes in magnetic flux due to the primary current over a second predetermined area within the known region, the magnetic flux time rate changes due to the primary current sensed over the first area being a predetermined calibrated amount different from the magnetic flux time rate changes due to the primary current sensed over the second area; and generating a current inducing magnetic flux time rate changes over a third predetermined area to substantially offset the difference between the time rate changes in magnetic flux due to the primary current sensed over the first area and the time rate changes in magnetic flux due to the primary current sensed over the second area.

15. The method of claim 14, wherein the magnitude of the magnetic flux time rate changes sensed over the second predetermined area exceeds the magnitude of the magnetic flux time rate changes sensed over the first predetermined area.

16. The method of claim 14, wherein the magnitude of the magnetic flux time rate changes sensed over the first predetermined area exceeds the magnitude of the magnetic flux time rate changes sensed over the second predetermined area.

17. The method of claim 14, and further comprising the step of measuring the current generated which induces magnetic flux time rate changes over the third predetermined area.

18. The method of claim 17, and further comprising the step of converting the measurement of the current generated into a measurement of the primary current.

19. The method of claim 14, wherein the third predetermined area and the first predetermined area substantially overlap.

* * * * *